United States Patent [19]
Weigand

[11] Patent Number: 5,851,899
[45] Date of Patent: *Dec. 22, 1998

[54] GAPFILL AND PLANARIZATION PROCESS FOR SHALLOW TRENCH ISOLATION

[75] Inventor: Peter Weigand, Croton on Hudson, N.Y.

[73] Assignee: Siemens Aktiengesellschaft, Munich, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 694,072

[22] Filed: Aug. 8, 1996

[51] Int. Cl.⁶ ............................................ H01L 21/76
[52] U.S. Cl. .................... 438/427; 438/424; 438/692; 438/788
[58] Field of Search .................... 438/424, 427, 438/787, 788, 692

[56] References Cited

U.S. PATENT DOCUMENTS

| | | | |
|---|---|---|---|
| 4,962,064 | 10/1990 | Haskell et al. | 437/228 |
| 5,242,853 | 9/1993 | Sato et al. | 438/424 |
| 5,350,486 | 9/1994 | Huang | 156/633 |
| 5,385,861 | 1/1995 | Bashir et al. | 437/67 |
| 5,387,540 | 2/1995 | Poon et al. | 437/67 |
| 5,399,533 | 3/1995 | Pramanik et al. | 437/228 |
| 5,453,639 | 9/1995 | Cronin et al. | 257/510 |
| 5,494,857 | 2/1996 | Cooperman et al. | 437/228 |
| 5,498,565 | 3/1996 | Gocho et al. | 438/427 |

OTHER PUBLICATIONS

Chatterjee et al. "A Shallow Trench Isolation Study for 0.25/0.18 Mm Cmos Technologies and Beyond"; Symposium on VLSI Technology Digest of Technical Papers ; Jun. 1996 ; 156–157.

*Primary Examiner*—Trung Dang
*Attorney, Agent, or Firm*—Stanton C. Braden

[57] ABSTRACT

Described is a method for filling shallow trench isolation (STI) trenches in a semiconductor substrate of an integrated circuit with an insulating material and planarizing the resulting structure to the level of adjacent portions of the integrated circuit. The method comprises forming trenches in the non-active regions of a semiconductor substrate, depositing a layer of oxide in the trenches and over the surface of the semiconductor substrate, and removing the oxide from the active areas of the integrated circuit structure, leaving oxide-filled shallow trench isolation structures having a substantially planar topography with respect to the rest of the integrated circuit structure.

23 Claims, 5 Drawing Sheets

5,851,899

GAPFILL AND PLANARIZATION PROCESS FOR SHALLOW TRENCH ISOLATION

FIELD OF THE INVENTION

The field of the present invention relates generally to improvements in semiconductor fabrication processes and, more particularly, to a process for filling shallow trench isolation regions without gaps and the use of a planarization scheme which simplifies the chemical mechanical polishing process.

BACKGROUND OF THE INVENTION

As the size of integrated circuits is reduced, the components that make up the circuits must be positioned closer together in order to comply with the limited space available on a typical chip. Since current research is directed towards a greater density of active components per unit area of semiconductor substrate, effective isolation between circuits becomes all the more important. Conventional isolation of circuit components in modern integrated circuit technology takes the form of shallow trenches which are etched into the semiconductor substrate and filled with an insulating material such as silicon dioxide. These areas are generally referred to in the art as shallow trench isolation (STI) regions. STIs serve to isolate the active regions of the integrated circuit and, since the active areas of a given integrated circuit can be of virtually any size, the STI regions typically vary widely in dimensions.

Because of the complex topography of modern integrated circuits, a problem is often encountered in achieving a uniform oxide fill, especially when shallow trenches of widely varying widths are used. In order to address this problem, a number of methods have been developed for filling STIs with insulating materials and for planarizing the resulting structures in order to obtain a uniform planar topography. STI filling methods include chemical vapor deposition (CVD) and plasma enhanced chemical vapor deposition (PECVD), which take advantage of the fact that material can be transported as a vapor to a surface and deposited thereon. Additionally, sputtering techniques or thermal techniques which grow oxide layers directly in the trenches (such as the local oxidation of silicon [LOCOS] procedure) are also useful for filling STI regions. Planarization schemes such as resist etch back (REB) processes, reactive ion etching (RIE) methods, and chemical mechanical polishing (CMP) procedures are employed, alone or in combination, to planarize the surface of the semiconductor substrate.

Although all of the above-mentioned STI fill methods have been used successfully for filling both narrow and wide trenches in semiconductor substrates, voids have been observed in the insulative material of STI regions due to imperfect filling conditions. Hence, there exists a need for a gapless oxide filling technique for STI regions in modern integrated circuit processing schemes.

In addition to the need for a gapless oxide trench filling process, there exists a further problem in modern integrated circuit processing involving the planarization of the resulting structures. A highly planarized surface topography is desirable since it allows for the deposition of additional integrated circuit components and permits greater device density. Sophisticated planarization procedures are often required in modern integrated circuit construction, especially in the formation of devices having relatively wide trenches. This is due to the fact that film material deposited by conventional CVD processes typically covers depressions conformally, thereby replicating the depression's non-planar structure. This becomes a problem during the planarization of wide STIs due to the erosion of oxide which is most pronounced in these structures.

In order to better illustrate this problem, FIGS. 1A–1C depict portions of a prior art integrated circuit structure in which conventional oxide deposition and planarization schemes have been utilized. The integrated circuit structure 10, depicted in FIG. 1A, comprises a semiconductor substrate 12, which is preferably a silicon wafer that may have a plurality of active and non-active components (not shown) deposited thereon. The integrated circuit structure 10 has both narrow 14 and wide 16 STI regions, corresponding to the widely varying active and non-active regions which are typically present in such a circuit. The substrate 10 further has an insulating oxide layer 18 deposited over its entire surface. Typically, this oxide layer is deposited by conventional thermal CVD oxidation techniques. Such techniques include LPTEOS and O3/TEOS. A conventional thermal CVD oxidation process does not create an oxide layer with uniform thickness. Instead, the oxide layer generally conforms to the topography of the substrate (i.e., it has valleys in areas corresponding to trenches in the substrate and mountains corresponding to any surface structures present on the surface of the substrate). Oxide layer 18 deposited by conventional thermal CVD oxidation has been known to form gaps (not shown) in the narrow STI regions 14 and 16.

Still referring to FIG. 1A, a photoresist pattern layer 20 is disposed on the oxide layer 18. The purpose of this photoresist layer 20 is to define a globally and locally planar surface (after being coated with dual or multiple layers of planarizing material, e.g., photoresist), such that in a subsequent etching process this planar topography is transferred into the oxide topography.

Referring now to FIG. 1B, there is shown the integrated circuit structure 10 of FIG. 1A after a conventional etchback process has been performed. The photoresist layer has also been removed and is not shown in this figure. The etchback process removes parts of the the oxide layer 18, leaving a substantially planar surface 22 over the narrow STIs 14 but an uneven and non-planar topography 24 over the wide STIs 16.

FIG. 1C shows the integrated circuit structure 10 of FIG. 1B after a conventional CMP step has been performed. The CMP step typically uses a silicon nitride layer (present on the surface of the silicon substrate, but not shown) as an etch stop. The CMP step selectively removes only the oxide layer 18, leaving the substrate 10 undamaged. A problem with current etch and polish techniques, however, is the difficulty in controlling the etch rate. Long CMP steps, for example, have been known to cause oxide erosion, especially in the widest of STIs. As can be seen in FIG. 1C, during STI planarization using a long CMP planarization step, the erosion of oxide, particularly in the wide STI 16, poses a major problem. The surface of the oxide layer 18 is not planar, dipping below the surface 26 of the semiconductor substrate 12 and resulting in an uneven topography. This phenomenon is especially pronounced at the center 28 of the oxide layer 18 in the wide STI 16.

Attempts to solve the problem of providing a highly planarized integrated circuit structure, after having formed oxide-filled STI regions in the substrate, have resulted in a number of planarization schemes, some requiring rather elaborate processing steps. One such method is described in U.S. Pat. No. 5,453,639, entitled "PLANARIZED SEMICONDUCTOR STRUCTURE USING SUBMINIMUM FEATURES", which was issued to J. E. Cronin et al. and assigned to the International Business Machines Corporation. The planarization scheme presented therein involves creating a series of subminimum (i.e., 50 to 500 thick) silicon pillars extending vertically upward from the base of a wide trench and then oxidizing the pillars. When the substrate is covered with a CVD oxide, the pillars prevent the formation of a single deep depression above the trench. Instead, a series of relatively shallow depressions (positioned between the silicon pillars) are formed, with the depths significantly less if the silicon pillars have not been provided. The resultant surface is therefore easier to planarize.

Other less sophisticated processing schemes have been proposed in order to minimize the number of processing steps in the fabrication of a planar surface topography in modern integrated circuits. These methods typically include the deposition of additional etch stop or planarizing layers to the integrated circuit processing scheme in order to reduce the effects of the etch-back processes. One such method is described in U.S. Pat. No. 5,494,857 entitled CHEMICAL MECHANICAL PLANARIZATION OF SHALLOW TRENCHES IN SEMICONDUCTOR SUBSTRATES, issued to S. S. Cooperman et al. and assigned to the Digital Equipment Corporation. The process flow according to this patent includes the deposition of a layer of silicon nitride over the STI-containing semiconductor substrate, followed by the deposition of a conformal coating of oxide, a thin layer of etch-stop silicon, and a second layer of oxide. The second layer of oxide is patterned with a filler mask and etched to the silicon etch-stop layer. CMP techniques are then applied in order to polish the remaining oxide back to the silicon nitride layer. A similar scheme is proposed in U.S. Pat. No. 4,962,064 entitled METHOD OF PLANARIZATION OF TOPOLOGIES IN INTEGRATED CIRCUIT STRUCTURES, issued to J. D. Haskell et al. and assigned to Advanced Micro Devices, Inc.

The use of additional etch stop layers has advantageously enabled the production of integrated circuit structures with highly planarized surface topographies. However, this advantage is achieved at a cost. The additional etch stop layers require additional processing steps to form, thus invariably reducing the efficiency while adding to the overall cost of integrated circuit production.

It is therefore an object of the present invention to provide an improved process flow which fills the STI trenches without gaps and which uses a planarization scheme that does not require complex processing steps or the addition of etch stop layers.

SUMMARY OF THE INVENTION

A method for fabricating devices including the process for forming isolation between device structures formed on the surface of a substrate is described. The method comprises defining active and non-active regions on the surface of the substrate and forming isolation trenches in the non-active regions. A layer of insulating material, such as oxide, is formed on the surface of the substrate, effectively filling the trenches without any gaps or voids. Portions of the insulation layer is selectively removed, enabling the subsequent planarization step, which exposes the active regions, to be shortened. By shortening the amount of time needed to expose the active regions, erosion of the insulating material in the isolation trenches is effectively reduced to produce a substantially uniform topography.

BRIEF DESCRIPTION OF THE DRAWINGS

In order to better understand the present invention, reference should be made to the following detailed description and corresponding drawings, wherein.

DETAILED DESCRIPTION OF THE INVENTION

The present invention provides an improved method for filling the STI regions of an integrated circuit structure with a substantially gapless oxide layer and a planarization scheme which shortens the CMP step in order to reduce oxide erosion. It should be noted that the process steps and structures described herein do not necessarily form a complete process flow for manufacturing integrated circuits. It is anticipated that the present invention may be practiced in conjunction with integrated circuit fabrication techniques currently used in the art. As such, only the process steps which are necessary for an understanding of the present invention are included.

Figure 2A:
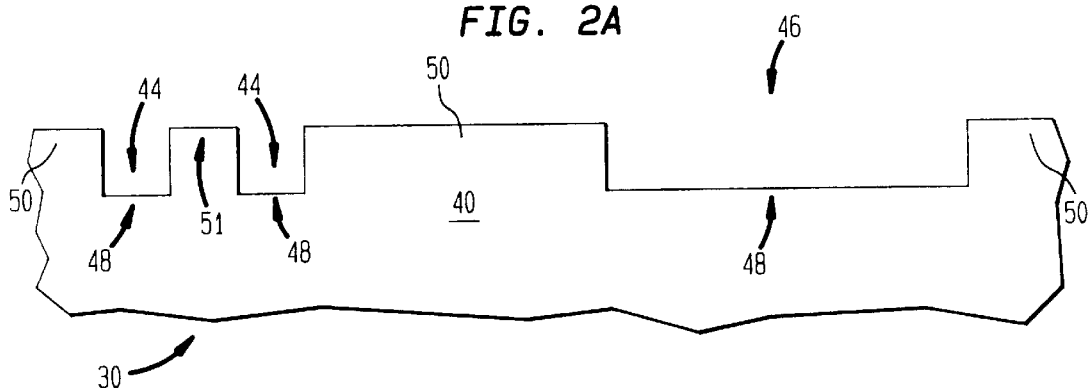
FIGS. 2A–2B depict cross-sectional views illustrating a portion of an integrated circuit structure in various stages of fabrication in accordance with a preferred embodiment of the inventive method.

An embodiment of the present invention is described herein, beginning with a partially completed integrated circuit structure 30 as shown in FIG. 2A. The structure 30 is formed on a substrate 40, which, for example, comprises a semiconductor material such as silicon. The substrate may itself comprise layers of structure stacked one upon the other. For purposes of discussion, such structures are generally referred herein as a substrate. Active 50 and 51 and non-active 48 areas are defined on the surface using, for example, a photoresist mask (not shown) or equivalent photolithographic technique. In general, devices are formed in or on the active areas. Shallow trenches 44 and 46 are formed in the non-active areas to isolate the devices. The shallow trenches are formed by, for example, etching or removing a portion of the substrate from the surface. Photoresist masking techniques and methods of etching trenches in semiconductor substrates are well known in the art and will not be discussed further.

Typically, a photoresist mask covers the active regions 50 and 51 of the integrated circuit structure 30, preventing them from being etched while simultaneously allowing trenches 44 and 46 to be etched in the non-active regions 48 of the integrated circuit 30. In an integrated circuit structure, the active components generally vary in size. Consequently, the size of the active regions also vary. As depicted, active regions 51 are of the narrow variety and active regions 50 are of the wider variety. Also, due to the variety in size of the active areas, the shallow trenches may be of the relatively narrow variety 44 or of the wider variety 46. The actual size of the active areas and the shallow trenches are not critical. As it is desirable to fabricate integrated circuit structures with high component density, the narrow variety typically corresponds to about the minimum feature size or groundrule while the wider variety corresponds to about greater than the minimum feature size. The surface geometry of the substrate 40 thus contains active areas 50 and 51 of near constant height which are separated by trenches 44 and 46 of varying widths.

Figure 2B:
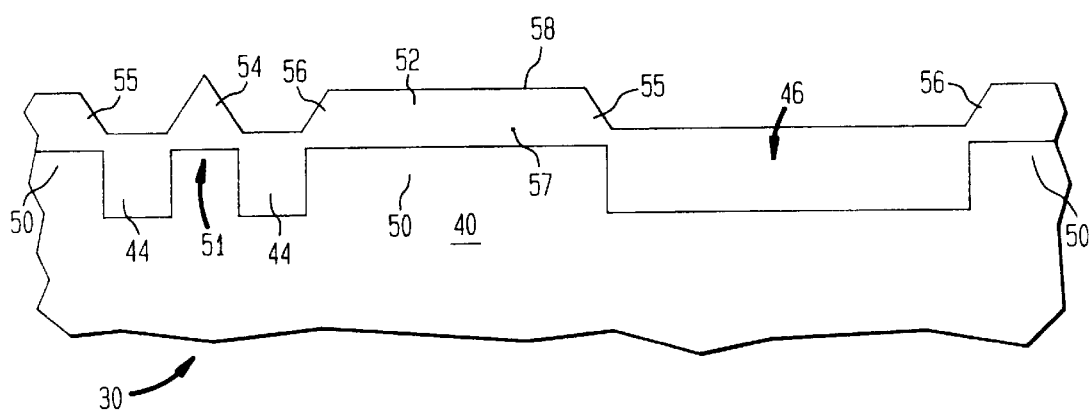

Generally, when shallow trenches such as 44 and 46 are formed in a semiconductor wafer, the objective is to fill the trenches with a dielectric material and further to obtain a flat or planar substrate having shallow trenches. The dielectric material can be any dielectric material or a material convertible into a dielectric. Such materials include silicon, silicon nitride, silicon oxide, silicon implanted with nitrogen, and the like. FIG. 2B shows an oxide layer 52 formed over the surface of the substrate, thus filling the shallow trenches with a dielectric material. Formation of the oxide layer is achieved by plasma-enhanced chemical vapor deposition (PECVD) using a high density plasma source (HDP-CVD). Such HDP-CVD techniques, for example, employ the use of an inductively coupled plasma source. HDP-CVD techniques are described in Francombe, *Physics of Thin Film*, Academic Press (1994), which is herein incorporated by reference for all purposes.

The use of HDP-CVD techniques advantageously fills the shallow trenches substantially without any gaps. As previously discussed, conventional filling techniques of shallow trenches, which include thermal oxidation and CVD techniques, create gaps in the shallow trenches. Thus, HDP-CVD techniques reduce or eliminate the formation of gaps in the shallow trenches usually associated with conventional trench filling techniques. Electron cyclotron and helicon wave excited plasma techniques are also useful for depositing the oxide layer. Such techniques are also described in Francombe, *Physics of Thin Film*, Academic Press (1994), already herein incorporated by reference for all purposes.

Referring still to FIG. 2B, it can be seen that the HDP-CVD oxide layer 52 completely covers the surface of the semiconductor substrate 40. The HDP-CVD oxide layer 52 has a thickness sufficient to completely fill the shallow trenches 44 and 46. The filling of the shallow trenches also coats the surface of the substrate. As can be seen in FIG. 2B, the HDP-CVD technique provides a unique filling shape in the array. Above the active areas 50 and 51, the HDP-CVD oxide protrudes angularly from the shallow trenches, forming substantially sloping edges 55 and 56 as the oxide layer coats the surface of the substrate. Illustratively, the sloping edges form small oxide triangles 54 above the narrow active areas 51. The oxide layer 52 above the wide active areas 50, comprises substantially complimentary sloping edges 55 and 56 with a planar central portion 58. Although the complementary edges 55 and 56 above the wide active areas 50 do not merge to form a triangle, the oxide layer at these regions, nevertheless, is triangular in shape.

Figure 1A:
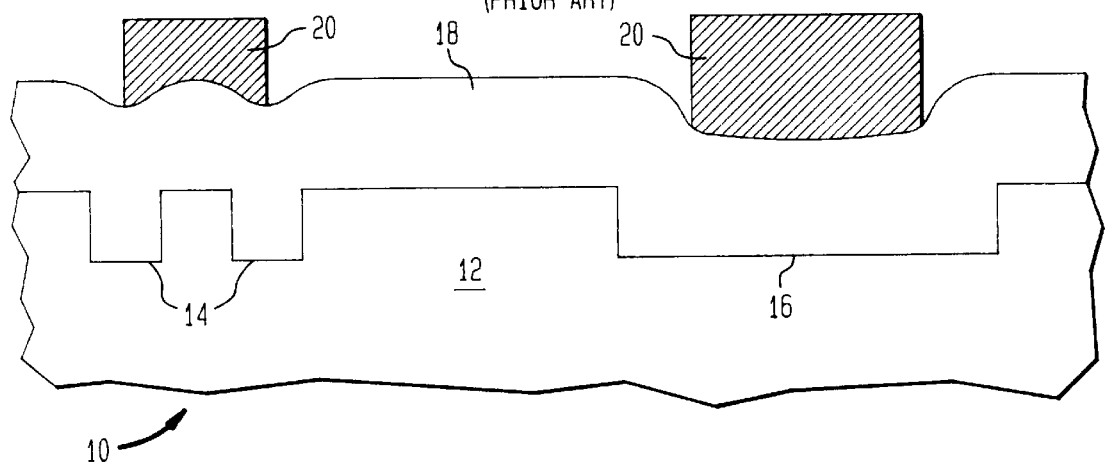
FIG. 1A depicts varying width shallow trench isolation structures in a portion of a typical integrated circuit structure which have been filled with oxide by a thermal CVD process.
Figure 1B:
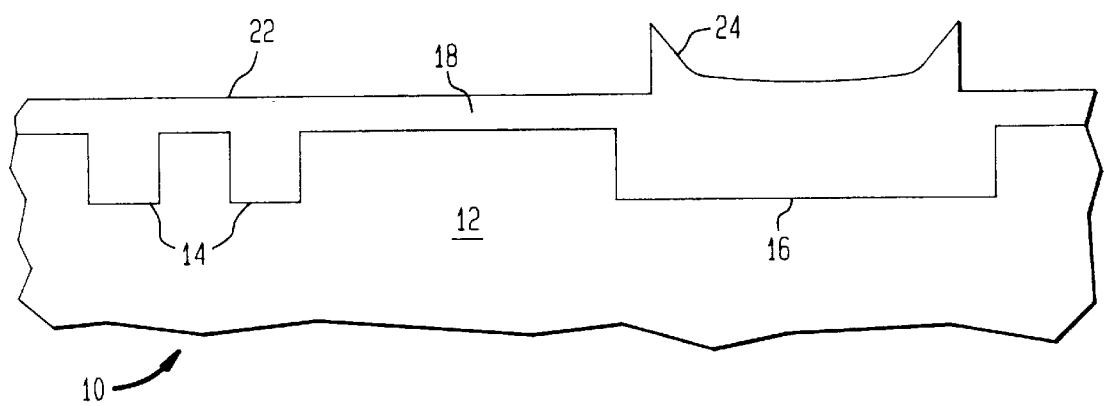
FIG. 1B depicts the integrated circuit of FIG. 1A after an etchback process which removes parts of the oxide layer has been performed.
Figure 1C:
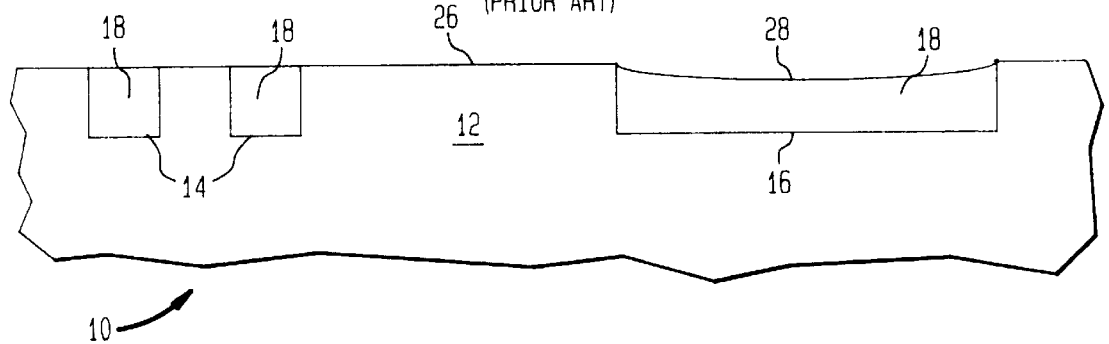
FIG. 1C depicts the integrated circuit of FIG. 1B after a conventional CMP step.

The unique triangular shapes 54 and 57 are due to the in-situ sputtering that occurs during the HDP-CVD process. Such triangular shapes are not observed in oxide layers formed by conventional thermal or CVD techniques. The absence of the triangular shapes is due to the conformality of the conventional deposition processes, resulting in a topography with valleys and hills (as described previously with reference to FIGS. 1A–1C).

Keep in mind however that the formation of triangles 54 is not critical and is shown for purposes of illustration. Whether the oxide layer forms triangles above the active areas, i.e., the merging of the two complementary sloping edges 55 and 56, depends on the width of the active areas and the thickness of the oxide layer. For example, some narrow active areas may not be narrow enough for the complementary edges to merge. As such, a shape of the oxide layer would be a triangular shape similar to that located above the wide active areas except with a narrower planar central portion.

Figure 3A:
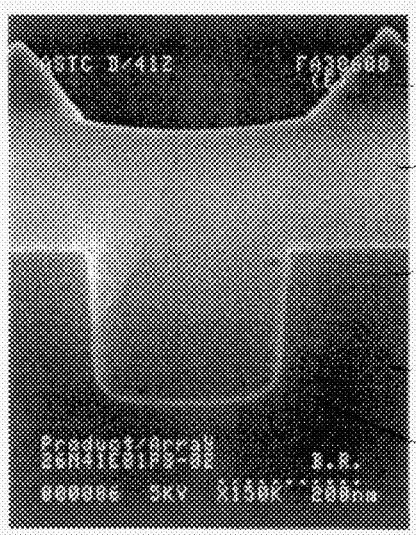
FIGS. 3A–3B depict SEM photographs showing HDP-CVD oxide filled STI regions of an integrated circuit structure made in accordance with the inventive method.
Figure 3B:
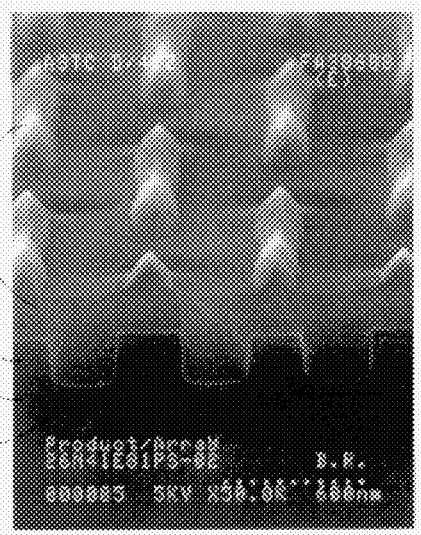

FIGS. 3A–3B are SEM photographs of a portion of the integrated circuit structure 30 of the present invention. The photographs show STI structures which have been filled with HDP-CVD oxide 52 that has been deposited by an inductively coupled plasma source (as described above). FIG. 3A concentrates on a single STI of the narrow type, while FIG. 3B depicts an array of such STIs. Notice should be taken of the excellent gapfill of the HDP-CVD oxide layer 52 and the small triangles 54 left above the small active areas 50 on the substrate 40. The substrate 40 and narrow trenches 44 are also clearly visible in the photographs.

The oxide layer is then planarized to expose the active areas. The triangular-shaped oxide regions above the STIs allow the CMP step in the planarization scheme to be shortened. The purpose of the CMP step is to polish the surface of the substrate to 1) remove the oxide layer in order to expose the active areas, and 2) to obtain a uniform planar topography. Shortening the polishing step reduces oxide erosion in the STI trenches, thereby avoiding unevenness in the surface caused by conventional planarization schemes. In some instances, shortening the CMP step also reduces erosion of the narrow active regions that can occur with an extended CMP step. As it will be apparent from the subsequent discussion, the use of HDP-CVD oxide as a STI fill advantageously enables the height of the oxide in the STI to be substantially determined by the deposition process and not by the CMP removal.

The duration of the CMP step depends on the time needed to remove the oxide in order to expose the active area. Referring back to FIG. 2B, it is clear that the amount of oxide above the wide active areas 50 is greater than that above narrow active areas 51. As such, the duration of the CMP step is typically based on the time it takes to expose the wide active areas. However, as previously discussed, the time required for the conventional CMP step to expose the wide active areas is generally too long and excessive oxide erosion in the wide STIs occurs. Also, the CMP step may overpolish the narrow active areas, causing erosion therein. As a result, an unplanar topography is produced.

In accordance with the invention, the CMP step is shortened to avoid excessive erosion of the STIs and narrow active regions. In one embodiment, shortening of the CMP step is achieved by selectively removing portions of the oxide from the triangular-shaped oxide regions above the active areas. By reducing the amount of oxide needed to be removed in order to expose the active areas, the corresponding CMP step is shortened. Typically, the amount of oxide that is removed from the active regions is sufficient to effectively shorten the CMP step so as to expose the active areas without excessive oxide erosion occurring in the STIs, thus resulting in a substantially planar surface.

Typically, the time needed to remove the amount of oxide in triangles 54 above the narrow active areas 51 is sufficiently short to result in a substantially planar surface in the STIs. As such, the amount of oxide remaining above the wide active regions 50 should not exceed the amount in the triangles 54. If a portion of center if the oxide region 52 is removed, then each of the remaining side portions should not exceed about the amount of oxide in the triangle 54.

Figure 4A:
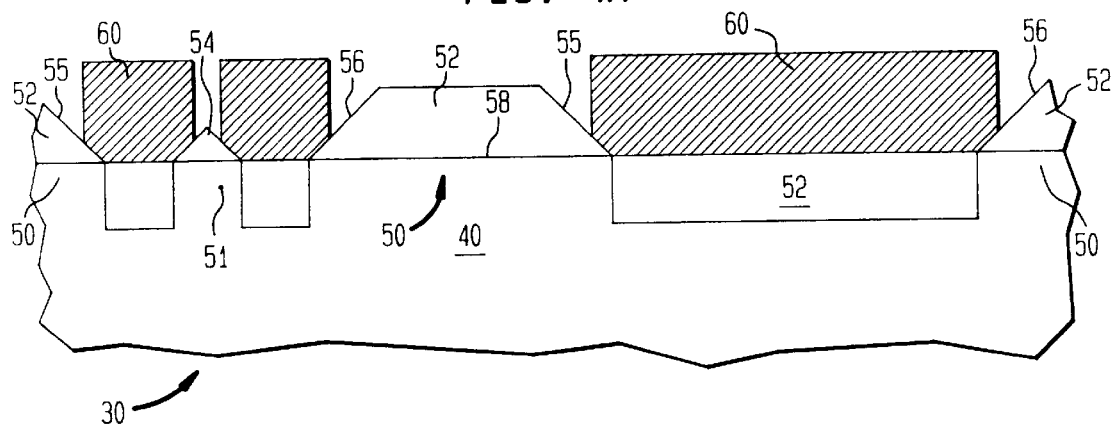
FIGS. 4A–4D depict cross-sectional views illustrating a portion of an integrated circuit structure in various stages of fabrication in accordance with a preferred embodiment of the inventive method.
Figure 4B:
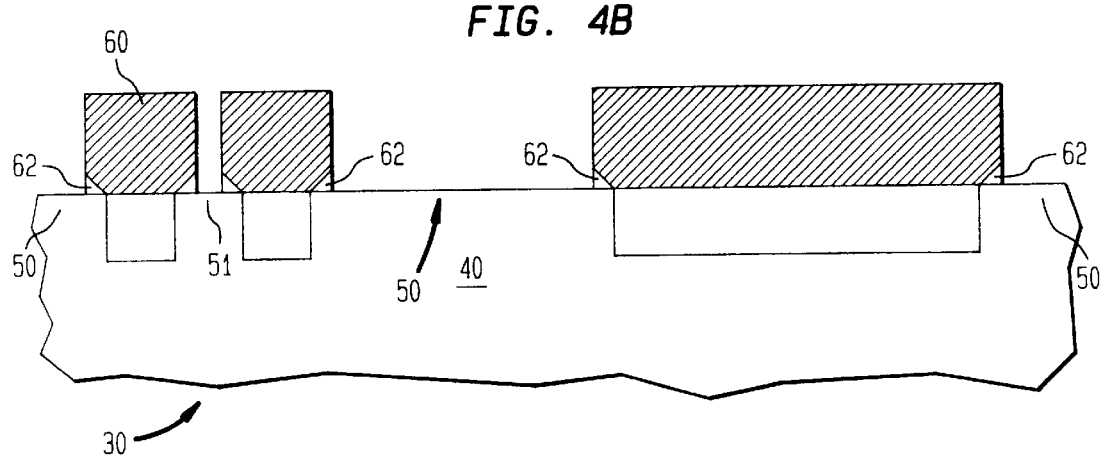
Figure 4C:
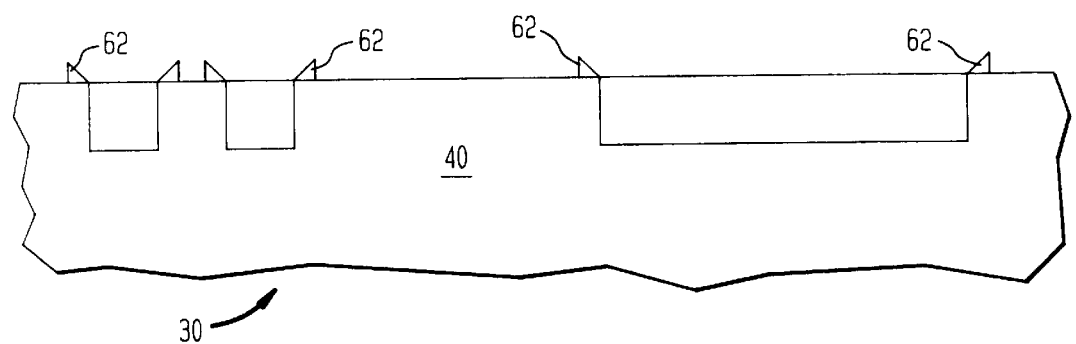

FIGS. 4A–4C show the removal of the portion of the oxide layer from the active areas of integrated device structure 30. Portions of the HDP-CVD oxide layer 52 are removed to expose the active areas 50 and 51. As shown in FIG. 4A, a photoresist layer 60 is formed and patterned over the HDP-CVD oxide layer 52 to expose the active areas. In one embodiment, an inverse active area mask (not shown) is used to form and pattern the HDP-CVD oxide layer. Such a mask is the negative mask of the mask used to form the active areas. Techniques for biasing the inverse mask are well known in the art. Typically, there are overlay inaccuracies associated with the lithograhic process. To compensate for the overlay inaccuracies, the inverse mask is biased. The amount of bias is sufficient to effectively shift the edges of the photoresist onto the sloping edges 55 and 56 of the HDP-CVD oxide layer. The maximum bias allowable depends on the performance of the CMP step.

Typically, the bias is between about an amount which is sufficient to effectively shift the edges of the photoresist onto the sloping edges to about an amount which effectively shortens the polishing step so as to expose the active areas with a substantially planar surface. In one embodiment, the amount of bias is sufficient to shift the edges of the photoresist onto the sloping edges 55 and 56 to about an amount which covers the sloping edges of the oxide layer. By covering the sloping edges, the triangles 54 would be covered with photoresist (not shown). As a result, only portions of the oxide layer above the wide active areas 50 would be removed. Preferably, the amount of bias is sufficient to effectively shift the mask to cover between about 5–95% of the sloping edges of the oxide layer. More preferably, the amount of bias is sufficient to effectively shift the mask to cover between about 10–90% of the sloping edges of the oxide layer. Even more preferably, the amount of bias is sufficient to shift the mask to effectively cover between about 25–85% of the sloping edges of the oxide layer. Most preferably, the amount of bias is sufficient to shift the mask to effectively cover between about 20–80% of the sloping edges of the oxide layer.

Since overlays are not critical for this lithography step in devices with structures with 0.25 um groundrules, a mid-ultra violet (MUV) lithography technique can also be used. The use of the inverse biased area mask advantageously eliminates the need to randomly generate a new mask in order to expose the active areas. The regions of the oxide layer 52 unprotected by photoresist are then etched using a suitable etching technique (such as RIE). The RIE etching step is oxide selective. By employing an oxide selective RIE, the silicon substrate and resist act as etch stops. Thus, the RIE removes only the HDP-CVD oxide layer 52, exposing the semiconductor substrate surface above those areas not covered by the photoresist layer 60.

As shown in FIG. 4B, the RIE etching process results in the removal of portions of the HDP-CVD oxide layer 52 overlying the active regions. It can also be seen that wedge-shaped portions 62 of the HDP-CVD oxide layer 52 are left on the surfaces of the edges of the active areas after the RIE etching step. These wedge-shaped portions 62 are removed in a subsequent CMP step.

Referring now to FIG. 4C, the next steps in the integrated circuit planarization scheme are depicted. The photoresist mask described above has been removed using an ashing or similar process. These processes are familiar to those skilled in the art and will not be discussed further here. The ashing process removes only the photoresist masking layer, leaving the wedge-shaped 62 HDP-CVD oxide portions on the surface of the semiconductor substrate 40. The resulting structure is then exposed to a final CMP step which removes all of the remaining HDP-CVD oxide structures 62, leaving a highly planarized topography to the semiconductor substrate 40. Because of the steps taken in the above-described technique regarding the small size of the HDP-CVD oxide structures, this particular CMP step can be kept short, thus minimizing the oxide erosion in the STIs trenches, particularly in the wide STIs trenches.

Figure 4D:
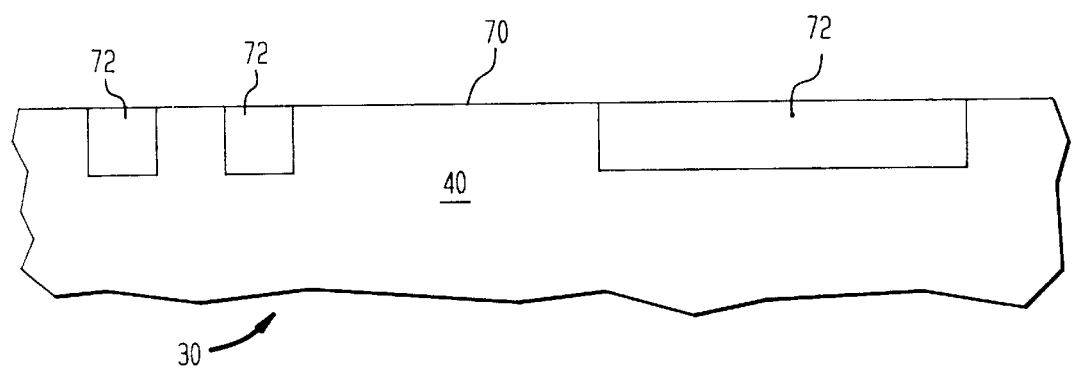

Referring now to FIG. 4D, the final planarized semiconductor substrate of the integrated circuit structure is depicted. As can be inferred from the figure, the top surface 70 of the semiconductor substrate 40 of the integrated circuit 30 is substantially planar with respect to the top surface of the HDP-CVD oxide-filled shallow trench isolation trenches 72. Since the CMP step is kept short, it is the HDP-CVD oxide deposition process which determines the height of the oxide in the STIs, not the CMP removal step. This is advantageous when compared to prior art processes since it avoids the problem of overpolishing due to extended CMP times which result in the excess erosion of oxide from the STIs. After the integrated circuit structure 30 of the present invention has been provided with a highly planarized surface structure containing STI regions which permit device isolation, it can then be further processed in accordance with known integrated circuit technology.

As should now be apparent, the present invention substantially overcomes many of the problems associated with prior art gapfill and planarization schemes in integrated circuit fabrication processes. The HDP-CVD oxide layer deposited by an inductively coupled plasma source provides an insulating oxide layer in the STI regions of the substrate. The insulating layer fills these regions without gaps while simultaneously forming triangular-shaped surface structures. Portions of the triangular structures are then removed to shorten the subsequent CMP process. Moreover, since the CMP step can be reduced, the problems associated with prior art oxide erosion are substantially avoided.

It should be understood that the embodiments described herein are merely exemplary and that a person skilled in the art may make reasonable variations and modifications to these embodiments utilizing functionally equivalent elements to those described herein. For example, this invention is equally applicable to any substrate surface geometry which has regions of a near constant height, separated by the same or different lateral distances. It should also be noted that the starting surface geometry of the substrate which is to be planarized could be at any one of a number of different stages during the wafer fabrication process. The regions separating the trenches could represent active regions, as described herein, or islands or other structures known to be present on an integrated circuit structure. Any and all such variations or modifications, as well as others which may become apparent to those skilled in the art, are intended to be included with the scope of the invention as defined by the appended claims.

What is claimed:

1. A method for fabricating devices including the step of forming isolation between device structures fabricated on a substrate comprising:

defining active and non-active regions on a surface of the substrate;

forming isolation trenches of varying widths the active regions comprising active regions of varying width in the non-active regions;

forming a layer of HDP-CVD insulating material of silicon oxide, wherein the HDP-CVD silicon oxide layer is non-planar and protrudes angularly above isolation trench edges forming sloping edges that slope away from the trench on the substrate by high density plasma-enhanced chemical vapor deposition (HDP-CVD), the HDP-CVD layer substantially filling the trenches and covering the active regions;

removing at least a portion of the insulating material covering the active regions; and planarizing the surface of said substrate to expose the active regions, the removal of at least a portion of insulating material from the active regions providing a planar topography; wherein removing of at least a portion of the insulating material from the active regions includes:

depositing a mask layer over the insulating material;

patterning the mask layer to expose at least a portion of the insulating material over the active regions; and removing the exposed portion of the insulating material over the active regions, leaving unexposed portions of the insulating materials; and wherein the mask layer is deposited using an inverse active area mask that is biased so that the mask layer after patterning covers the non-active regions and at least a portion of the active regions.

2. A method according to claim 1 wherein the inverse active area mask is biased so that the mask layer after patterning covers at least a portion of the sloping edges of the insulating layer in the active regions.

3. A method according to claim 1 wherein the mask is biased sufficiently so that the mask layer after patterning covers about 5–95% of the sloping edges.

4. A method according to claim 1 wherein the mask is biased sufficiently so that the mask layer after patterning covers about 10–90% of the sloping edges.

5. A method according to claim 1 wherein the mask is biased sufficiently so that the mask layer after patterning covers about 25–85% of the sloping edges.

6. A method according to claim 1 wherein the mask is biased sufficiently so that the mask layer covers about 20–80% of the sloping edges.

7. A method according to claim 1 further including the step of removing the mask layer after removing the exposed insulating material.

8. A method for fabricating devices including the step of forming isolation between structures fabricated on a substrate comprising:

defining active and non-active regions on a surface of the substrate, wherein the non-active regions comprise narrow and wide non-active regions and active regions comprise narrow and wide active regions;

forming isolation trenches in the non-active regions;

forming a layer of HDP-CVD insulating material of silicon oxide that is non-planar and protrudes angularly above isolation trench edges forming sloping edges that slope away from the trench on the substrate by high density plasma-enhanced chemical vapor deposition (HDP-CVD), the HPD-CVD layer substantially filling the trenches and covering the active regions;

removing at least a portion of the insulating material covering the wide active regions; and planarizing the surface of said substrate to expose the active regions, the removal of at least a portion of insulating material from the wide active regions enabling a planar topography to be provided by the planarizing step; wherein removing at least a portion of the insulating material from the wide active regions includes:

depositing a mask layer over the insulating material;

patterning the mask layer to expose at least a portion of the insulating material over the wide active regions; and removing the exposed portion of the insulating material over the wide active regions, leaving unexposed portions of the insulating materials; and wherein the mask layer is deposited using an inverse active area mask that is biased so that the mask layer after patterning covers the non-active regions and at least a portion of the wide active regions.

9. A method according to claim 8 wherein the inverse active area mask is biased so that the mask layer after patterning covers at least a portion of the sloping edges of the insulating layer in the wide active regions.

10. A method according to claim 9 wherein the mask is biased sufficiently so that the mask layer after patterning covers about 5–95% of the sloping edges.

11. A method according to claim 9 wherein the mask is biased sufficiently so that the mask layer after patterning covers about 10–90% of the sloping edges.

12. A method according to claim 9 wherein the mask is biased sufficiently so that the mask layer after patterning covers about 25–85% of the sloping edges.

13. A method according to claim 9 wherein the mask is biased sufficiently so that the mask layer covers about 20–80% of the sloping edges.

14. A method according to claim 9 further including the step of removing the mask layer after removing the exposed insulating material.

15. A method for fabricating devices including the step of forming isolation between structures fabricated on a substrate comprising:

defining active and non-active regions on a surface of the substrate, wherein the non-active regions comprise narrow and wide non-active regions and active regions comprise narrow and wide active regions;

forming isolation trenches in the non-active regions;

forming a layer of HDP-CVD insulating material of silicon oxide that is non-planar and protrudes angularly above isolation trench edges forming sloping edges that slope away from the trench on the substrate by high density plasma-enhanced chemical vapor deposition (HDP-CVD), the HPD-CVD layer substantially filling the trenches and covering the active regions;

removing at least a portion of the insulating material covering the wide active regions;

wherein the removing of at least a portion of the insulating material from the active regions includes:

depositing a mask layer over the insulating material;

patterning the mask layer to expose at least a portion of the insulating material over the active regions; and removing the exposed portion of the insulating material over the active regions, leaving unexposed portions of the insulating materials; and planarizing the surface of said substrate to expose the active regions, the removal of at least a portion of insulating material from the wide active regions enabling a planar topography to be provided by the planarizing step; wherein the mask layer is deposited using an inverse active area mask that is biased so that the mask layer after patterning covers the non-active regions and at least a portion of the active regions.

16. A method according to claim 15 wherein the inverse active area mask is biased so that the mask layer after patterning covers at least a portion of the sloping edges of the insulating layer in the active regions.

17. A method according to claim 16 wherein the mask is biased sufficiently so that the mask layer after patterning covers about 5–95% of the sloping edges.

18. A method according to claim 16 wherein the mask is biased sufficiently so that the mask layer after patterning covers about 10–90% of the sloping edges.

19. A method according to claim 16 wherein the mask is biased sufficiently so that the mask layer after patterning covers about 25–85% of the sloping edges.

20. A method according to claim 16 wherein the mask is biased sufficiently so that the mask layer covers about 20–80% of the sloping edges.

21. A method according to claim 16 further including the step of removing the mask layer after removing the exposed insulating material.

22. A method of planarizing shallow isolation trenches in a substrate comprising:

depositing a silicon oxide layer formed in an inductively coupled high density plasma chamber by chemical vapor deposition so as to fill said trenches and cover the surface of the substrate, thereby forming a non-planar layer over the surface that angles away from the edges of the trenches;

depositing a photoresist layer on the oxide layer and patterning the photoresist layer with an inverse active area mask while biasing the layer so that the photoresist overlies at least a portion of the angled oxide layer;

removing the silicon oxide in the exposed regions;

removing the photoresist; and planarizing the surface of the substrate.

23. A method according to claim 22 wherein the surface of the substrate is planarized by removing the remaining silicon oxide by chemical metal polishing.

\* \* \* \* \*